(12) United States Patent
Song et al.

(10) Patent No.: US 11,903,288 B2
(45) Date of Patent: Feb. 13, 2024

(54) ORGANIC LIGHT-EMITTING DEVICE

(71) Applicant: Samsung Display Co., LTD., Yongin-si (KR)

(72) Inventors: Hajin Song, Yongin-si (KR); Jihwan Yoon, Yongin-si (KR); Sangwoo Lee, Yongin-si (KR); Sangwoo Pyo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/154,471

(22) Filed: Jan. 13, 2023

(65) Prior Publication Data

US 2023/0157114 A1    May 18, 2023

Related U.S. Application Data

(63) Continuation of application No. 17/201,737, filed on Mar. 15, 2021, now Pat. No. 11,581,371, which is a
(Continued)

(30) Foreign Application Priority Data

Oct. 28, 2015   (KR) ......................... 10-2015-0150453

(51) Int. Cl.
*H10K 59/35* (2023.01)
*H10K 50/15* (2023.01)
(Continued)

(52) U.S. Cl.
CPC ............ *H10K 59/35* (2023.02); *H10K 50/11* (2023.02); *H10K 50/125* (2023.02); *H10K 50/15* (2023.02);
(Continued)

(58) Field of Classification Search
CPC ...... H10K 59/35; H10K 50/11; H10K 50/125; H10K 50/15; H10K 50/16; H10K 71/00;
(Continued)

(56) References Cited

U.S. PATENT DOCUMENTS 6,639,250 B1   10/2003   Shimoda et al.
7,038,757 B2    5/2006   Park et al.
(Continued)

FOREIGN PATENT DOCUMENTS

KR   10-2013-0115027 A   10/2013
KR   10-2014-0018123 A    2/2014
(Continued)

*Primary Examiner* — Thanh Y. Tran
(74) *Attorney, Agent, or Firm* — Lewis Roca Rothgerber Christie LLP

(57) ABSTRACT

An organic light-emitting device and display apparatus, the device including a first electrode; a second electrode facing the first electrode; an emission layer between the first and second electrode; a hole control layer between the first electrode and the emission layer; and an electron control layer between the emission layer and the second electrode, wherein the emission layer includes a plurality of sub-emission layers to emit light having different wavelengths, at least portions of the plurality of sub-emission layers do not overlap one another, the plurality of sub-emission layers include: a first sub-emission layer including a first color light-emitting dopant, and a second sub-emission layer including a second color light-emitting dopant, the first and second sub-emission layers each include a hole-transporting and electron-transporting host which form an exciplex, and a triplet energy of the exciplex is equal to or greater than triplet energies of the first and second color light-emitting dopant.

15 Claims, 11 Drawing Sheets

Related U.S. Application Data continuation of application No. 16/852,875, filed on Apr. 20, 2020, now Pat. No. 10,971,554, which is a continuation of application No. 16/432,375, filed on Jun. 5, 2019, now Pat. No. 10,658,432, which is a continuation of application No. 15/870,389, filed on Jan. 12, 2018, now Pat. No. 10,325,960, which is a continuation of application No. 15/141,910, filed on Apr. 29, 2016, now Pat. No. 9,905,616.

(51) Int. Cl.
| | |
|---|---|
| *H10K 50/16* | (2023.01) |
| *H10K 50/11* | (2023.01) |
| *H10K 50/125* | (2023.01) |
| *H10K 59/131* | (2023.01) |
| *H10K 71/00* | (2023.01) |
| *H10K 50/852* | (2023.01) |
| *H10K 59/12* | (2023.01) |
| *H10K 85/60* | (2023.01) |
| *H10K 101/10* | (2023.01) |
| *H10K 101/40* | (2023.01) |
| *H10K 101/00* | (2023.01) |
| *H10K 101/30* | (2023.01) |

(52) U.S. Cl.
CPC .......... *H10K 50/16* (2023.02); *H10K 59/131* (2023.02); *H10K 71/00* (2023.02); *H10K 50/852* (2023.02); *H10K 59/1201* (2023.02); *H10K 85/655* (2023.02); *H10K 85/6572* (2023.02); *H10K 2101/10* (2023.02); *H10K 2101/27* (2023.02); *H10K 2101/30* (2023.02); *H10K 2101/40* (2023.02); *H10K 2101/90* (2023.02)

(58) Field of Classification Search
CPC .......... H10K 2101/10; H10K 2101/27; H10K 2101/20; H10K 59/131; H10K 50/852; H10K 2101/90; H10K 50/12
See application file for complete search history.

(56) References Cited

U.S. PATENT DOCUMENTS

| | | | |
|---|---|---|---|
| 7,851,992 | B2 | 12/2010 | Lee et al. |
| 8,415,688 | B2 | 4/2013 | Song et al. |
| 9,577,205 | B2 | 2/2017 | Yoo et al. |
| 9,905,616 | B2 | 2/2018 | Song et al. |
| 10,325,960 | B2 | 6/2019 | Song et al. |
| 10,971,554 | B2 | 4/2021 | Song et al. |
| 2006/0227079 | A1 | 10/2006 | Kashiwabara |
| 2009/0079335 | A1* | 3/2009 | Mitsuya ................. H10K 50/00 313/504 |
| 2010/0051973 | A1 | 3/2010 | Kobayashi et al. |
| 2010/0133522 | A1 | 6/2010 | Pieh et al. |
| 2011/0303903 | A1 | 12/2011 | Yoshinaga et al. |
| 2012/0242219 | A1 | 9/2012 | Seo et al. |
| 2013/0303776 | A1* | 11/2013 | Okamoto ............... H05B 33/10 345/212 |
| 2014/0167015 | A1 | 6/2014 | Lee et al. |
| 2014/0264295 | A1 | 9/2014 | Sim et al. |
| 2014/0353596 | A1 | 12/2014 | Kim et al. |
| 2015/0187848 | A1 | 7/2015 | Kim |
| 2015/0280130 | A1* | 10/2015 | Sago .................... H10K 71/135 438/46 |
| 2016/0204371 | A1 | 7/2016 | Kim et al. |

FOREIGN PATENT DOCUMENTS

| | | |
|---|---|---|
| KR | 10-2014-0018133 A | 2/2014 |
| KR | 10-2014-0051126 A | 4/2014 |
| KR | 10-1427799 B1 | 8/2014 |
| KR | 10-2014-0115688 A | 10/2014 |
| KR | 10-2014-0140410 | 12/2014 |
| KR | 10-2015-0009259 A | 1/2015 |
| KR | 10-2015-0079035 | 7/2015 |

\* cited by examiner

ORGANIC LIGHT-EMITTING DEVICE

CROSS-REFERENCE TO RELATED APPLICATIONS

This application is a continuation of U.S. application Ser. No. 17/201,737, filed Mar. 15, 2021, which is a continuation of U.S. application Ser. No. 16/852,875, filed Apr. 20, 2020, now U.S. Pat. No. 10,971,554, which is a continuation of U.S. application Ser. No. 16/432,375, filed Jun. 5, 2019, now U.S. Pat. No. 10,658,432, which is a continuation of application continuation of U.S. application Ser. No. 15/870,389, filed Jan. 12, 2018, now U.S. Pat. No. 10,325,960, which is a continuation of continuation of U.S. application Ser. No. 15/141,910, filed Apr. 29, 2016, now U.S. Pat. No. 9,905,616, which claims priority to and the benefit of Korean Patent Application No. 10-2015-0150453, filed on Oct. 28, 2015, the entire contents of all of which are incorporated herein by reference.

BACKGROUND

1. Field

Embodiments relate to an organic light-emitting device, a method of fabricating the same, and an organic light-emitting display apparatus.

2. Description of the Related Art

An organic light-emitting device, as a self-emissive device, has wide viewing angles and excellent contrast. Also, the organic light-emitting device has fast response time, high brightness, and low operating voltage.

An organic light-emitting device may include an anode and a hole transport layer, an emission layer, an electron transport layer, and a cathode, which are sequentially disposed on the anode. Herein, the hole transport layer, the emission layer, and the electron transport layer are organic thin films that are formed of organic compounds.

The driving principle of the organic light-emitting device is as follows. When applying different voltages to the anode and the cathode, holes injected from the anode move to the emission layer through the hole transport layer, and electrons injected from the cathode move to the emission layer through the electron transport layer. The holes and electrons are recombined in the emission layer to generate excitons. Light is generated when the excitons are changed from an excited state to a ground state.

SUMMARY

Embodiments are directed to an organic light-emitting device, a method of fabricating the same, and an organic light-emitting display apparatus.

The embodiments may be realized by providing an organic light-emitting device, including a first electrode; a second electrode facing the first electrode; an emission layer between the first electrode and the second electrode; a hole control layer between the first electrode and the emission layer; and an electron control layer between the emission layer and the second electrode, wherein the emission layer includes a plurality of sub-emission layers to emit light having different wavelength ranges, at least portions of the plurality of sub-emission layers do not overlap one another, the plurality of sub-emission layers include: a first sub-emission layer including a first color light-emitting dopant, and a second sub-emission layer including a second color light-emitting dopant different from the first color light-emitting dopant, the first sub-emission layer and the second sub-emission layer each include a hole-transporting host and an electron-transporting host which form an exciplex, and a triplet energy of the exciplex is equal to or greater than triplet energies of the first color dopant and the second color dopant.

The first sub-emission layer and the second sub-emission layer may include a same hole-transporting host and a same electron-transporting host.

The triplet energy of the exciplex may be about 2.4 eV to about 3.0 eV.

A difference between a lowest unoccupied molecular orbital (LUMO) energy level of the hole-transporting host and a LUMO energy level of the electron-transporting host may be about 0.2 eV or more.

A difference between a highest occupied molecular orbital (HOMO) energy level of the hole-transporting host and a HOMO energy level of the electron-transporting host may be about 0.2 eV or more.

A weight ratio of the hole-transporting host to the electron-transporting host may be about 80:20 to about 20:80.

The plurality of sub-emission layers may further include a third sub-emission layer that includes a third color light-emitting dopant, the third color light-emitting dopant being different from the first color light-emitting dopant and the second color light-emitting dopant, and the third sub-emission layer may include the hole-transporting host and the electron-transporting host.

The third color light-emitting dopant may be a blue light-emitting dopant, and a difference between a triplet energy level of the exciplex and a singlet energy level of the blue light-emitting dopant may be about −0.1 eV to about 0.1 eV.

Each sub-emission layer of the plurality of sub-emission layers may further include an auxiliary layer.

Mixing ratios of the hole-transporting host and the electron-transporting host in the first to third sub-emission layers may each be different from one another.

The embodiments may be realized by providing a method of fabricating an organic light-emitting device, the method including forming a hole control layer on a first electrode; forming a plurality of sub-emission layers on the hole control layer; forming an electron control layer on the plurality of sub-emission layers; and forming a second electrode on the electron control layer, wherein forming the plurality of sub-emission layers includes: performing a first co-deposition of a first color light-emitting dopant and a mixed host material, the mixed host material including a hole-transporting host mixed with an electron-transporting host, and performing a second co-deposition of the mixed host material and a second color light-emitting dopant, the second color light-emitting dopant being different from the first color light-emitting dopant.

Forming the plurality of sub-emission layers may further include performing a third co-deposition of the mixed host material and a third color light-emitting dopant, the third color light-emitting dopant being different from the first color light-emitting dopant and different from the second color light-emitting dopant.

The method may further include providing an auxiliary layer on the hole control layer.

The embodiments may be realized by providing an organic light-emitting display apparatus including a timing controller; a scan driver; a source driver; and an organic light-emitting display panel, the organic light-emitting display panel including an organic light-emitting device, wherein the organic light-emitting device includes: a first electrode; a second electrode facing the first electrode; an emission layer between the first electrode and the second electrode; a hole control layer between the first electrode and the emission layer; and an electron control layer between the emission layer and the second electrode, wherein: the emission layer includes a plurality of sub-emission layers to emit light having different wavelength ranges, at least portions of the plurality of sub-emission layers do not overlap one another, the plurality of sub-emission layers include: a first sub-emission layer including a first color light-emitting dopant, and a second sub-emission layer including a second color light-emitting dopant different from the first color light-emitting dopant, the first sub-emission layer and the second sub-emission layer each include a hole-transporting host and an electron-transporting host which form an exciplex, and a triplet energy of the exciplex is equal to or greater than triplet energies of the first color light-emitting dopant and the second color light-emitting dopant.

The plurality of sub-emission layers may further include a third sub-emission layer, the third sub-emission layer may include the hole-transporting host, the electron-transporting host, and a third color light-emitting dopant, the third color light-emitting dopant being different from the first color light-emitting dopant and the second color light-emitting dopant, and a difference between a triplet energy level of the exciplex and a singlet energy level of the third light-emitting dopant is about −0.1 eV to about 0.1 eV.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
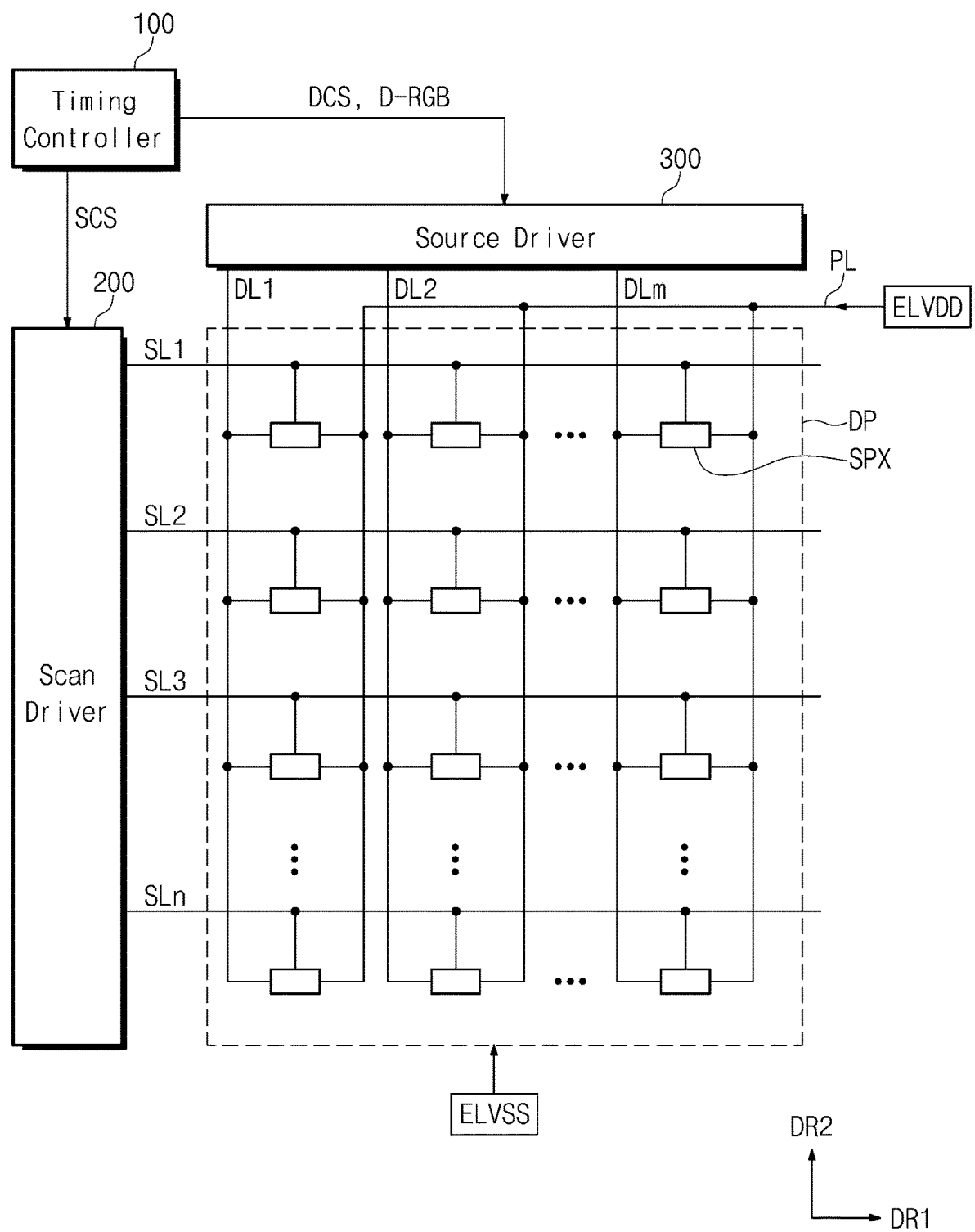
FIG. 1 illustrates a block diagram of an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. For example, a first element could be termed a second element, and, similarly, a second element could be termed a first element. The terms of a singular form may include plural forms unless referred to the contrary. The term "or" is not an exclusive term.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, an organic light-emitting device according to an embodiment and an organic light-emitting display apparatus will be described with reference to the accompanying drawings.

Figure 2:
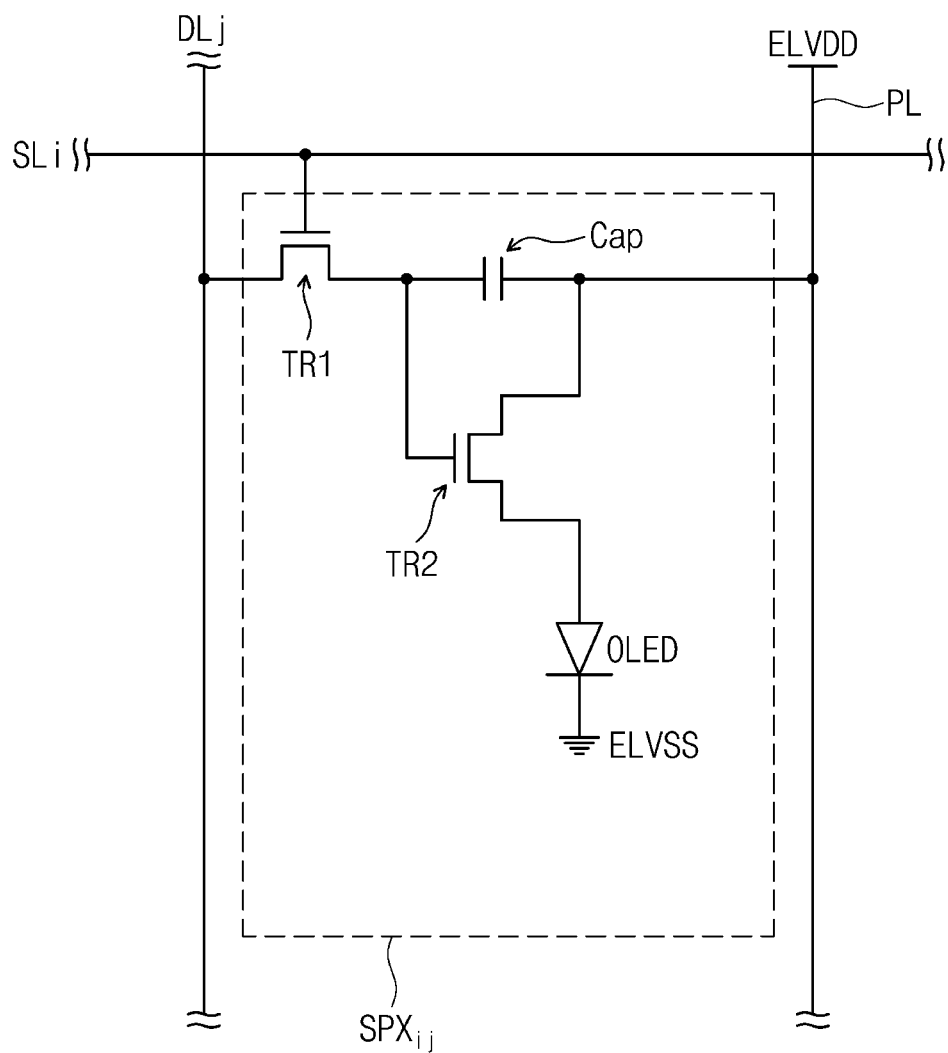
FIG. 2 illustrates a circuit diagram of a sub-pixel according to an embodiment.

FIG. 1 illustrates a block diagram of an organic light-emitting display apparatus of an embodiment. FIG. 2 illustrates an equivalent circuit diagram of a sub-pixel in the organic light-emitting display apparatus of FIG. 1. The organic light-emitting display apparatus according to the embodiment will be described with reference to FIGS. 1 and 2.

As illustrated in FIG. 1, the organic light-emitting display apparatus may include a timing controller 100, a scan driver 200, a source driver 300, and an organic light-emitting display panel DP. The organic light-emitting display panel DP may include an organic light-emitting device according to an embodiment. The organic light-emitting device according to the embodiment will be described in detail below.

The timing controller 100 receives input image signals and generates image data D-RGB by converting a data format of the input image signals to match specification of an interface to the source driver 300. The timing controller 100 outputs the image data D-RGB and various control signals DCS and SCS.

The scan driver 200 receives the scan control signal SCS from the timing controller 100. The scan control signal SCS may include a vertical start signal starting the operation of the scan driver 200 and a clock signal determining the output times of signals. The scan driver 200 generates gate signals in response to the scan control signal SCS and sequentially outputs the gate signals to scan lines SL1 to SLn to be described later.

As illustrated in FIG. 1 the gate signals may be output from the single scan driver 200. In an implementation, the organic light-emitting display apparatus may include a plurality of scan drivers. The scan drivers may output different gate signals.

The source driver 300 receives the data control signal DCS and the image data D-RGB from the timing controller 100. The source driver 300 converts the image data D-RGB into the data signals and outputs the data signals to source lines DL1 to DLm to be described later. The data signals are analog voltages respectively corresponding to gray scale values of the image data D-RGB.

The organic light-emitting display panel DP includes the scan lines SL1 to SLn, the source lines DL1 to DLm, and sub-pixels SPX. The scan lines SL1 to SLn extend along a first directional axis DR1 and are arranged along a second directional axis DR2 crossing the first directional axis DR1. The source lines DL1 to DLm insulatively cross the scan lines SL1 to SLn. The organic light-emitting display panel DP according to an embodiment may further include signal lines which are dependent on a circuit configuration of the sub-pixels SPX to provide signals different from the gate signals and data signals to the sub-pixels SPX.

Each of the sub-pixels SPX is connected to a corresponding scan line among the scan lines SL1 to SLn and a corresponding source line among the source lines DL1 to DLm. Each of the sub-pixels SPX receives a first voltage ELVDD and a second voltage ELVSS having a lower level than the first voltage ELVDD. Each of the sub-pixels SPX is connected to a power line PL to which the first voltage ELVDD is applied.

FIG. 2 exemplarily illustrates an equivalent circuit diagram of a single sub-pixel SPXij which is connected to an i-th scan line SLi and a j-th source line DLj. In an implementation, other sub-pixels illustrated in FIG. 1 may also have the same equivalent circuit.

As illustrated in FIG. 2, the sub-pixel SPXij includes at least one transistor, at least one capacitor, and a sub-organic light-emitting device OLED. Although a pixel circuit including two transistors and one capacitor has been exemplarily illustrated in the present embodiment, the configuration of the sub-pixel SPXij is not limited thereto.

The sub-pixel SPXij includes a first transistor TR1, a second transistor TR2, a capacitor Cap, and the sub-organic light-emitting device OLED. The first transistor TR1 outputs a data signal applied to the j-th source line DLj in response to a gate signal applied to the i-th scan line SLi. The capacitor Cap charges a voltage corresponding to the data signal received from the first transistor TR1. The second transistor TR2 controls a driving current flowing in the sub-organic light-emitting device OLED in correspondence with the voltage stored in the capacitor Cap.

In this case, the sub-organic light-emitting device OLED included in the organic light-emitting display apparatus according to the embodiment may correspond to a part of the organic light-emitting device according to the embodiment to be described later or an organic light-emitting device having a sub-emission layer which is distinguished in an embodiment.

Figure 3:
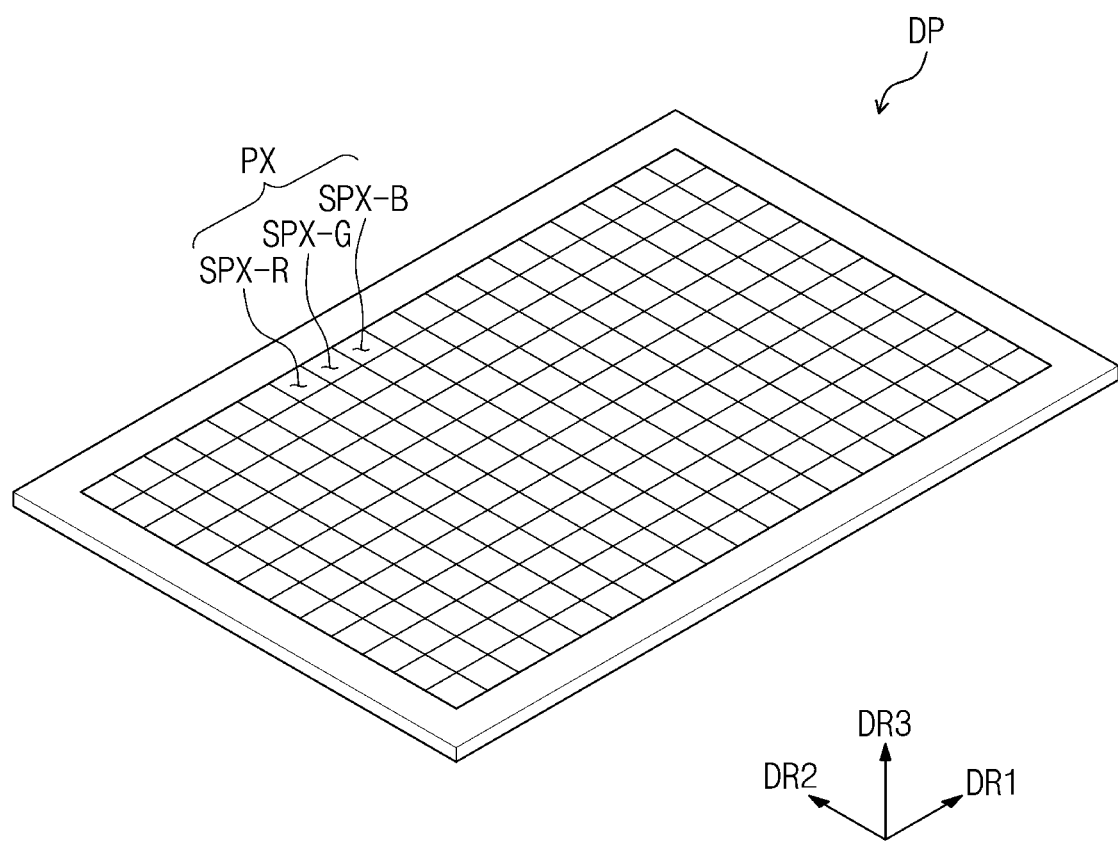
FIG. 3 illustrates a perspective view of an organic light-emitting display panel according to an embodiment.
Figure 4:
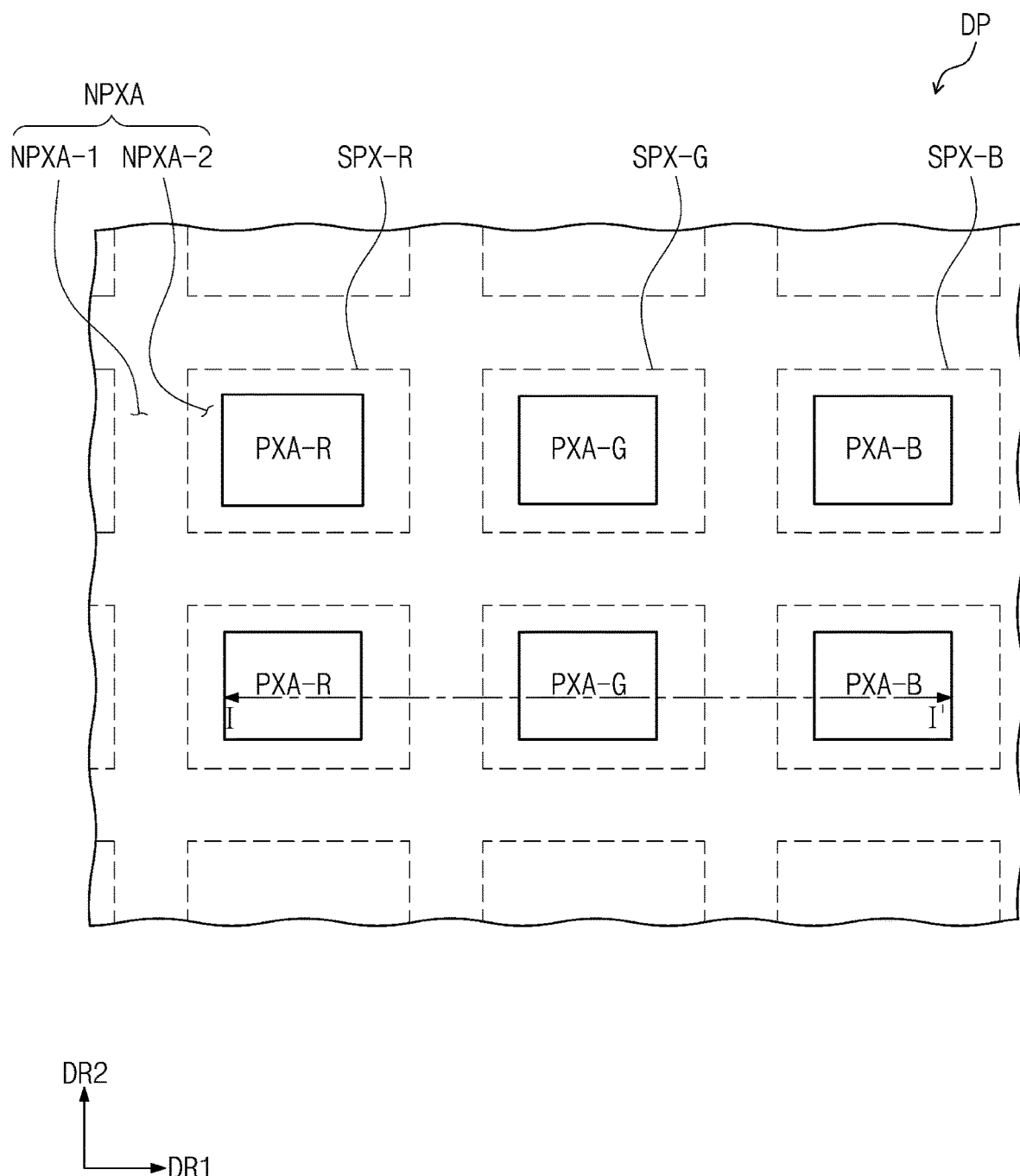
FIG. 4 illustrates a plan view of the organic light-emitting display panel according to the embodiment.

FIG. 3 illustrates a perspective view of the organic light-emitting display panel DP, and FIG. 4 illustrates a plan view of the organic light-emitting display panel DP.

As illustrated in FIG. 3, the organic light-emitting display panel DP may include a plurality of sub-pixels SPX-R, SPX-G, and SPX-B. Three types of the sub-pixels SPX-R, SPX-G, and SPX-B are exemplarily illustrated, and the three types of the sub-pixels SPX-R, SPX-G, and SPX-B may generate light having different colors. For example, the three types of the sub-pixels SPX-R, SPX-G, and SPX-B may respectively emit red light, green light, and blue light. The three types of the sub-pixels SPX-R, SPX-G, and SPX-B according to an embodiment may respectively emit magenta light, yellow light, and cyan light. The three types of the sub-pixels SPX-R, SPX-G, and SPX-B may emit light along a third directional axis DR3 of FIG. 3.

Combination of the sub-pixels SPX-R, SPX-G, and SPX-B generating light having different colors is defined as a pixel PX. As illustrated in FIG. 3, the pixel PX may include the three types of the sub-pixels SPX-R, SPX-G, and SPX-B.

The pixel PX according to an embodiment may be a part corresponding to the organic light-emitting device according to the embodiment to be described below. Also, the sub-pixels constituting the pixel may respectively correspond to light-emitting areas of the organic light-emitting device having different sub-emission layers.

As illustrated in FIG. 4, the organic light-emitting display panel DP is divided into a plurality of light-emitting areas PXA-R, PXA-G, and PXA-B and a non-emitting area NPXA on a plane which is defined by the first directional axis DR1 and the second directional axis DR2. Three types of the light-emitting areas PXA-R, PXA-G, and PXA-B arranged in a matrix form are exemplarily illustrated in FIG. 4. Each of the sub-emission layers of the organic light-emitting device according to the embodiment may be correspondingly disposed in the three types of the light-emitting areas PXA-R, PXA-G, and PXA-B.

The non-emitting area NPXA may be divided into first non-emitting areas NPXA-1 surrounding the three types of the light-emitting areas PXA-R, PXA-G, and PXA-B and a second non-emitting area NPXA-2 between the first non-emitting areas NPXA-1. Signal lines, for example, the scan line SLi (see FIG. 2), the source line DLj (see FIG. 2), and the power line PL (see FIG. 2), are disposed in the first non-emitting area NPXA-1. A circuit of the sub-pixel corresponding to each of the second non-emitting areas NPXA-2, for example, the transistors TR1 and TR2 (see FIG. 2) or the capacitor Cap (see FIG. 2) are disposed.

Hereinafter, the organic light-emitting device according to the embodiment included in the above-described organic light-emitting display apparatus according to the embodiment will be described with reference to the accompanying drawings.

Figure 5:
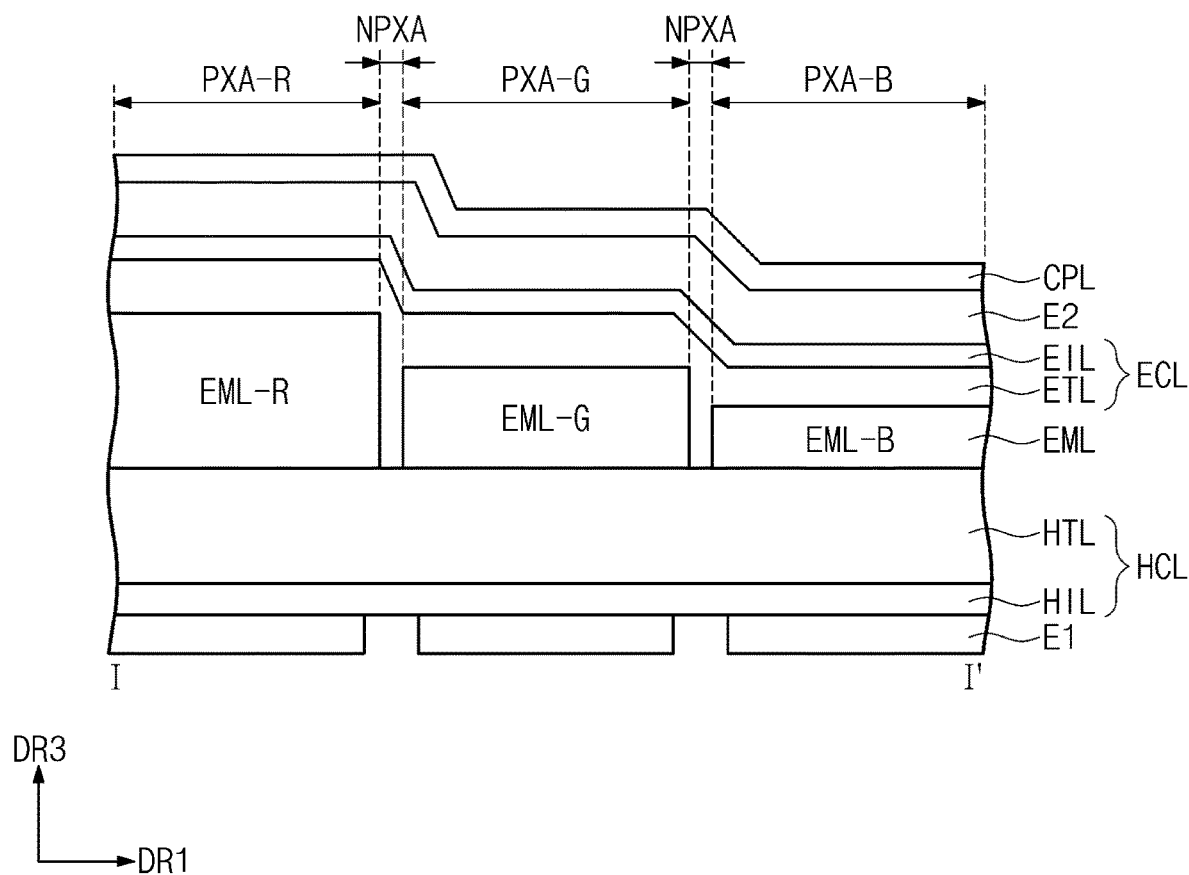
FIG. 5 illustrates a cross-sectional view of an organic light-emitting device according to an embodiment.

FIG. 5 illustrates a cross-sectional view of the organic light-emitting device according to the embodiment. The organic light-emitting device of FIG. 5 may be a portion of a cross-sectional view taken along line I-I' of FIG. 4.

The organic light-emitting device according to the embodiment may include a first electrode E1 and a second electrode E2 facing each other, a hole control layer HCL between the first electrode and the second electrode, an emission layer EML, and an electron control layer ECL.

In an embodiment, the hole control layer HCL may be between the first electrode E1 and the emission layer EML, and the electron control layer ECL may be between the emission layer EML and the second electrode E2. In an implementation, the emission layer EML may include a plurality of sub-emission layers EML-R, EML-G, and EML-B to emit light having different wavelength ranges.

In an implementation, the first electrode E1 may be an anode. The anodes, as the first electrodes E1, may be spaced apart from one another in a first direction DR1 on a cross-section and may be provided as a plurality of regions. For example, referring to FIG. 5, the plurality of regions of the first electrodes E1 spaced apart from one another and provided in the first direction DR1 may be respectively disposed to be opposite to (e.g., aligned with or underlying) the plurality of sub-emission layers EML-R, EML-G, and EML-B. For example, the first electrodes E1 may be spaced apart from one another and may be overlap (e.g., underlie) the plurality of sub-emission layers EML-R, EML-G, and EML-B in a thickness direction of the device.

The first electrode E1 may be a transmissive electrode, a transflective electrode, or a reflective electrode. In a case in which the first electrode E1 is a transmissive electrode, the first electrode E1 may be formed of a transparent metal oxide, e.g., indium tin oxide (ITO), indium zinc oxide (IZO), zinc oxide (ZnO), and indium tin zinc oxide (ITZO). In a case in which the first electrode E1 is a transflective electrode or a reflective electrode, the first electrode E1 may include silver (Ag), magnesium (Mg), aluminum (Al), platinum (Pt), palladium (Pd), gold (Au), nickel (Ni), neodymium (Nd), iridium (Ir), chromium (Cr), or a mixture of metals. The first electrode E1 may be a single layer or may have a multilayered structure having a plurality of layers.

The hole control layer HCL may be on the first electrode E1. As illustrated in FIG. 5, the hole control layer HCL may provide a flat surface, or the hole control layer HCL may be provided to have a step.

The hole control layer HCL may be a single layer formed of a single material, may be a single layer including a plurality of different materials, or may have a multilayered structure having a plurality of layers which is formed of a plurality of different materials. As illustrated in FIG. 5, the hole control layer HCL may include a hole injection layer HIL and a hole transport layer HTL.

In an implementation, the hole injection layer HIL and the hole transport layer HTL may be formed of a single layer and may include a p-type dopant. In an implementation, the hole control layer HCL may further include at least one of a hole buffer layer and an electron blocking layer.

The hole injection layer HIL may be formed by including a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4''-tris(3-methylphenyl phenylamino)triphenylamine (m-MTDATA), 4,4'4''-tris(N,N-diphenylamino)triphenylamine (TDATA), 4,4',4''-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), or (polyaniline)/poly(4-styrenesulfonate) (PANI/PSS).

The hole injection layer HIL may further include a charge generating material for improving conductivity. The charge generating material may be uniformly or non-uniformly dispersed in the hole injection layer HIL. The charge generating material, e.g., may be a p-type dopant. At least a portion of the hole injection layer HIL may include a p-type dopant. The p-type dopant may include, e.g., one of a quinone derivative, a metal oxide, and a cyano group-containing compound. Examples of the p-type dopant may include a quinone derivative, such as tetracyanoquinodimethane (TCNQ) and 2,3,5,6-tetrafluoro-tetracyanoquinodimethane (F4-TCNQ), and a metal oxide such as tungsten oxide and molybdenum oxide.

The hole transport layer HTL may be provided on the hole injection layer HIL. The hole transport layer HTL may include a carbazole-based derivative, e.g., N-phenyl carbazole and polyvinyl carbazole, a fluorine-based derivative, a triphenylamine-based derivative, such as N,N'-bis(3-methylphenyl)-N,N'-diphenyl-[1,1-biphenyl]-4,4'-diamine (TPD) and 4,4',4''-tris(N-carbazolyl)triphenylamine (TCTA), N,N'-di(1-naphthyl)-N,N'-diphenylbenzidine (NPB), or 4,4'-cyclohexylidene bis[N,N-bis(4-methylphenyl)benzenamine] (TAPC).

Each of the functional layers constituting the hole control layer HCL may be formed by using various methods such as a vacuum deposition method, a spin coating method, a casting method, a Langmuir-Blodgett (LB) method, an ink-jet printing method, a laser printing method, and a laser induced thermal imaging (LITI) method.

The emission layer EML, which includes the plurality of sub-emission layers EML-R, EML-G, and EML-B that emit light having different wavelength ranges, may be disposed on the hole control layer HCL. At least portions of the plurality of sub-emission layers EML-R, EML-G, and EML-B may be disposed so as not to overlap one another.

For example, referring to FIG. 5, the sub-emission layers EML-R, EML-G, and EML-B may be spaced apart from one another in the first direction DR1 (which is a direction perpendicular to a third direction DR3 as the thickness direction of the organic light-emitting device). For example, in the embodiment illustrated in FIG. 5, the plurality of sub-emission layers EML-R, EML-G, and EML-B may be disposed so as not to overlap one another. For example, the plurality of sub-emission layers EML-R, EML-G, and EML-B may not overlap or otherwise be aligned along the third direction DR3 such that a line extending in the third direction DR3 does not pass through more than one of the plurality of sub-emission layers EML-R, EML-G, and EML-B.

As illustrated in FIG. 5, the sub-emission layers EML-R, EML-G, and EML-B may be spaced apart from one another and independently disposed along the first direction DR1 on the cross-section. In an implementation, the sub-emission layers EML-R, EML-G, and EML-B may be disposed adjacent to one another (e.g., directly adjacent to or laterally contacting one another) or may be disposed so that at least portions thereof overlap one another in the third direction DR3 (e.g., the thickness direction).

The electron control layer ECL may be disposed on the emission layer EML. The electron control layer ECL may be disposed to surround each of the sub-emission layers EML-R, EML-G, and EML-B of the emission layer EML. The electron control layer ECL may be provided on an entire area of the emission layer EML. For example, the electron control layer ECL may cover tops and sides of each of the sub-emission layers EML-R, EML-G, and EML-B of the emission layer EML. The electron control layer ECL may further include an electron transport layer ETL and an electron injection layer EIL on the electron transport layer ETL. In an implementation, the electron injection layer EIL may be omitted.

The electron transport layer ETL may include, e.g., tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (ADN), and a mixture thereof. A thickness of the electron transport layer ETL may be about 100 Å to about 1,000 Å, e.g., about 150 Å to about 500 Å. In a case in which the thickness of the electron transport layer ETL satisfies the above-described range, satisfactory electron transport characteristics may be obtained without a substantial increase in driving voltage.

In an implementation, LiF, lithium quinolate (LiQ), $Li_2O$, BaO, NaCl, CsF, a lanthanide metal, such as ytterbium (Yb), or a metal halide, such as RbCl and RbI, may be used as the electron injection layer EIL. The electron injection layer EIL may also be formed of a material in which an electron transport material and an insulating organometallic salt are mixed. The organometallic salt may be a material having an energy band gap of about 4 eV or more. Examples of the organometallic salt may include metal acetate, metal benzoate, metal acetoacetate, metal acetylacetonate, or metal stearate. A thickness of the electron injection layer EIL may be about 1 Å to about 100 Å, e.g., about 3 Å to about 90 Å. In a case in which the thickness of the electron injection layer EIL satisfies the above-described range, satisfactory electron injection characteristics may be obtained without a substantial increase in driving voltage.

The second electrode E2 may be provided on the electron control layer ECL. The second electrode E2 may be a cathode. The second electrode E2 may be provided on an entire area of the electron control layer ECL. The second electrode E2 may be a transmissive electrode, a transflective electrode, or a reflective electrode. In a case in which the second electrode E2 is a transmissive electrode, the second electrode E2 may include lithium (Li), calcium (Ca), LiF/Ca, LiF/Al, Al, Mg, BaF, barium (Ba), Ag, or a compound or mixture thereof (e.g., mixture of Ag and Mg).

The second electrode E2 may include an auxiliary electrode. The auxiliary electrode, e.g., may include indium tin oxide (ITO), indium zinc oxide (IZO), zinc oxide (ZnO), indium tin zinc oxide (ITZO), molybdenum (Mo), and titanium (Ti).

In a case in which the second electrode E2 is a transflective electrode or a reflective electrode, the second electrode E2 may include Ag, Mg, copper (Cu), Al, Pt, Pd, Au, Ni, Nd, Ir, Cr, Li, Ca, LiF/Ca, LiF/Al, Mo, Ti, or a compound or mixture thereof (e.g., mixture of Ag and Mg). In an implementation, the second electrode E2 may have a multilayer structure including a reflective layer or a transflective layer formed of the above materials and a transparent conductive layer formed of ITO, IZO, ZnO, or ITZO.

In a case in which the organic light-emitting device is a top emission type, the first electrode E1 may be a reflective electrode, and the second electrode E2 may be a transmissive electrode or a transflective electrode. In a case in which the organic light-emitting device is a bottom emission type, the first electrode E1 may be a transmissive electrode or a transflective electrode, and the second electrode E2 may be a reflective electrode.

In an implementation, an organic capping layer CPL may be provided on the second electrode E2. The organic capping layer CPL may reflect light, which is emitted from the emission layer EML, from a top surface of the organic capping layer CPL toward the emission layer EML. The reflected light may increase luminous efficiency of the organic light-emitting device by being amplified in the organic capping layer CPL by a resonance effect. The organic capping layer CPL may help reduce and/or prevent the loss of light from the second electrode E2 through total internal reflection of the light in a top-emission organic light-emitting device.

The organic capping layer CPL may include, e.g., at least one of N4,N4,N4',N4'-tetra(biphenyl-4-yl)biphenyl-4,4'-diamine (TPD15), 4,4',4''-tris(carbazol-9-yl)triphenylamine (TCTA), and N,N'-bis(naphthalen-1-yl)-N,N-bis(phenyl)-2,2'-dimethylbenzidine (α-NPD).

Referring to FIG. 5, portions, in which the sub-emission layers EML-R, EML-G, and EML-B are disposed, may be the plurality of light-emitting areas PXA-R, PXA-G, and PXA-B, or a space, in which the sub-emission layers EML-R, EML-G, and EML-B are spaced apart from one another, may be a portion corresponding to the non-emitting area NPXA. Referring again to FIG. 4, the light-emitting areas PXA-R, PXA-G, and PXA-B of the organic light-emitting device defined by the sub-emission layers may be portions corresponding to the light-emitting areas PXA-R, PXA-G, and PXA-B of the organic light-emitting device illustrated in FIG. 4. Also, a portion represented by the non-emitting area NPXA in the organic light-emitting device of FIG. 5 may correspond to a portion corresponding to the non-emitting area NPXA in the organic light-emitting device of FIG. 4.

The plurality of sub-emission layers EML-R, EML-G, and EML-B of the emission layer in the organic light-emitting device according to the embodiment may respectively emit light having different wavelength ranges, e.g., different colors. The plurality of sub-emission layers EML-R, EML-G, and EML-B may be formed by including a host and a dopant. The plurality of sub-emission layers EML-R, EML-G, and EML-B may respectively include light-emitting dopants having or emitting different colors.

For example, a first sub-emission layer may be configured by including a first color light-emitting dopant as a red light-emitting dopant, and a second sub-emission layer may be configured by including a second color light-emitting dopant as a green light-emitting dopant. Also, a third sub-emission layer may be provided by including a third color light-emitting dopant as a blue light-emitting dopant. In an implementation, a light-emitting dopant having a different color, in addition to the light-emitting dopants having the above-listed colors, may be included.

With respect to the light-emitting dopants included in the plurality of sub-emission layers EML-R, EML-G, and EML-B, e.g., $Bt_2Ir(acac)$ or $Ir(piq)_3$ may be used as the red light-emitting dopant. In an implementation, $Ir(ppy)_3$, $Ir(ppy)_2(acac)$, and $Ir(mppy)_3$ may be used as the green light-emitting dopant, and Flrpic or DPAVBi may be used as the blue light-emitting dopant.

In an implementation, each of the sub-emission layers EML-R, EML-G, and EML-B may include a hole-transporting host and an electron-transporting host. In the organic light-emitting device according to the embodiment of, the first sub-emission layer EML-R and the second sub-emission layer EML-G may include both of the hole-transporting host and the electron-transporting host.

For example, in the organic light-emitting device according to the embodiment, the first sub-emission layer EML-R may include the hole-transporting host, the electron-transporting host, and a first light-emitting dopant, and the second sub-emission layer EML-G may include the hole-transporting host, the electron-transporting host, and a second light-emitting dopant. In this case, the first sub-emission layer EML-R and the second sub-emission layer EML-G may include the hole-transporting host and electron-transporting host which form an exciplex. The exciplex formed by a host material, in which the hole-transporting host and electron-transporting host, i.e., two hosts having different characteristics, are mixed, may have a new triplet energy level in the emission layer.

A suitable material that forms an exciplex having a triplet energy equal to or greater than triplet energies of the light-emitting dopants included in the sub-emission layers may be used as the hole-transporting host and electron-transporting host included in the sub-emission layers EML-R, EML-G, and EML-B.

The hole-transporting host included in the sub-emission layers EML-R, EML-G, and EML-B of the organic light-emitting device may include, e.g., carbazole-based compound, such as N,N'-di-[(1-naphthylenyl)-N,N'-diphenyl]-1,1'-biphenyl)-4,4'-diamine (NPB), 4,4',4"-tris(N-carbazolyl)triphenylamine (TCTA), 4,4'-bis(N-carbazolyl)-1,1'-biphenyl (CBP), polyvinyl carbazole, and m-biscarbazolyl phenyl.

For example, a compound represented by the following Formula 1 may be used as the hole-transporting host.

[Formula 1]

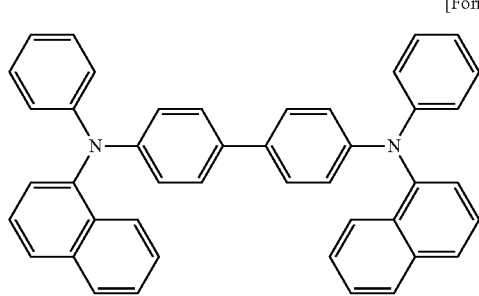

An energy gap between a highest occupied molecular orbital (HOMO) and a lowest unoccupied molecular orbital (LUMO) of the hole-transporting host used in the embodiment may be about 3.0 eV or more. For example, a HOMO energy level and a LUMO energy level of the hole-transporting host illustrated in Formula 1 may be about −5.4 eV and about −2.4 eV, respectively.

In an implementation, an anthracene-based or phenyl-based compound and a derivative thereof may be used as the electron-transporting host included in the sub-emission layers EML-R, EML-G, and EML-B of the organic light-emitting device. In an implementation, an organometallic complex including metal and organic ligand, a spirofluorene-based compound, an oxidiazole-based compound, a phenanthroline-based compound, a triazine-based compound, or a triazole-based compound may be used as the electron-transporting host. In an implementation, a compound represented by the following Formula 2 may be used as the electron-transporting host.

[Formula 2]

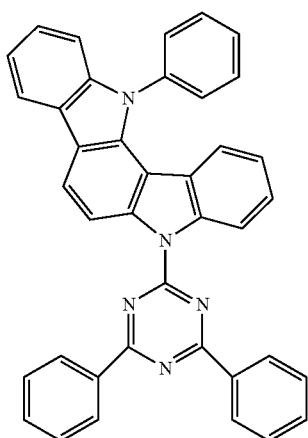

An energy gap between a HOMO and a LUMO of the electron-transporting host used in the embodiment may be about 3.0 eV or more. For example, a HOMO energy level and a LUMO energy level of the electron-transporting host illustrated in Formula 2 may be about −5.8 eV and about −2.7 eV, respectively.

Figure 6:
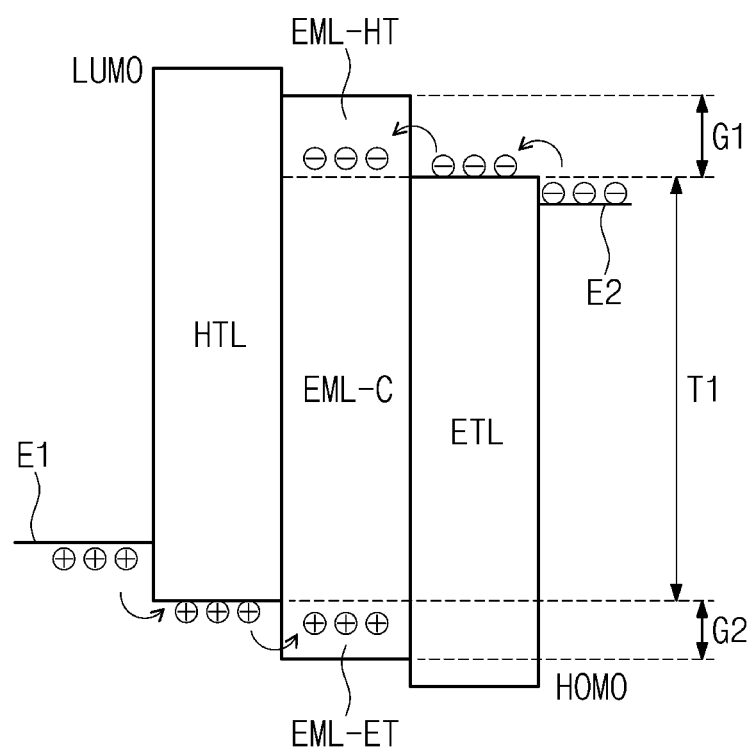
FIG. 6 illustrates an energy band diagram of the organic light-emitting device according to the embodiment.

FIG. 6 illustrates a schematic view of an energy band diagram of the organic light-emitting device according to the embodiment illustrated in FIG. 5. FIG. 6 exemplarily illustrates a case in which the organic light-emitting device according to the embodiment includes the hole transport layer HTL as a hole control layer and the electron transport layer ETL as an electron control layer. In an implementation, the hole control layer may further include other organic layers in addition to the hole transport layer, and the electron control layer may further include other organic layers in addition to the electron transport layer.

An energy band of the emission layer in FIG. 6 represents a case of including both of the hole-transporting host and the electron-transporting host, wherein the energy band of the emission layer may correspond to a portion including EML-HT, EML-C, and EML-ET. In this case, an energy band gap of the hole-transporting host may be a region including EML-C and EML-HT in FIG. 6. Also, an energy band gap of the electron-transporting host may be a region including EML-C and EML-ET. Thus, the energy band gap of the emission layer may be increased to a range including the LUMO energy level of the hole-transporting host and the HOMO energy level of the electron-transporting host.

Referring to FIG. 6, the HOMO energy level may be sequentially decreased from the first electrode E1 to the hole transport layer HTL and the emission layer. Thus, holes injected from the first electrode E1 may be provided gradually to the emission layer through the hole transport layer HTL.

Also, the LUMO energy level may be sequentially increased from the second electrode E2 to the electron transport layer ETL and the emission layer. Thus, electrons injected from the second electrode E2 may be provided gradually to the emission layer through the electron transport layer ETL.

In the emission layer, an exciplex may be formed by the hole-transporting host and the electron-transporting host. In this case, a triplet energy of the exciplex formed by the hole-transporting host and the electron-transporting host may correspond to T1 as a distance between the LUMO energy level of the electron-transporting host and the HOMO energy level of the hole-transporting host.

In the organic light-emitting device according to the embodiment, the triplet energy T1 of the exciplex formed by the hole-transporting host and the electron-transporting host may be about 2.4 eV to about 3.0 eV. For example, in the embodiment of FIG. 5, a case is described in which the first sub-emission layer EML-R is a layer including a red light-emitting dopant and the second sub-emission layer EML-G is a layer including a green light-emitting dopant.

In general, a triplet energy of the red light-emitting dopant included in the sub-emission layer may be about 2.0 eV and a triplet energy of the green light-emitting dopant may be about 2.4 eV, and both the sub-emission layer emitting red light and the sub-emission layer emitting green light may emit light when the triplet energy of the exciplex formed by the mixed host is about 2.4 eV or more. In a case in which the triplet energy of the exciplex is less than about 2.4 eV, light may not be emitted from the second sub-emission layer including a green light-emitting dopant.

Also, the triplet energy of the exciplex may be a value lower than the energy gap of each host material. Thus, the exciplex may have a triplet energy of about 3.0 eV or less, which is the energy gap of the hole-transporting host and the electron transporting host.

For example, in a case in which the triplet energy of the exciplex formed by the mixed hole-transporting host and electron transporting host is about 2.4 eV to about 3.0 eV, light may be emitted from the first sub-emission layer having a red light-emitting dopant and the second sub-emission layer having a green light-emitting dopant. Thus, the mixed host material may be simultaneously included in the first sub-emission layer and the second sub-emission layer, energy may be transferred to the light-emitting dopants respectively included in the first sub-emission layer and the second sub-emission layer, and thus, light may be effectively emitted. For example, in a case in which the emission layer includes the sub-emission layer emitting red light and the sub-emission layer emitting green light, the triplet energy of the exciplex formed by the hole-transporting host and electron transporting host may be about 2.7 eV to about 3.0 eV. In an implementation, the exciplex may have a triplet energy greater than a triplet energy level of the red light-emitting dopant and a triplet energy level of the green light-emitting dopant.

The organic light-emitting device according to the embodiment illustrated in FIG. 5 may further include the third sub-emission layer EML-B having a third color light-emitting dopant. The third color light-emitting dopant may be a blue light-emitting dopant. A singlet energy of a generally used blue light-emitting dopant may be about 2.6 eV to about 2.7 eV.

Thus, the organic light-emitting device according to the embodiment may be provided such that the mixed host of the hole-transporting host and the electron transporting host is included in all of the first to third sub-emission layers. In this case, the first sub-emission layer may include a red light-emitting dopant, the second sub-emission layer may include a green light-emitting dopant, and the third sub-emission layer may include a blue light-emitting dopant. In this case, a difference between the triplet energy of the exciplex formed by the hole-transporting host and electron-transporting host included in the first to third sub-emission layers and the singlet energy level of the blue light-emitting dopant as the third color light-emitting dopant may be about −0.1 eV to about 0.1 eV.

For example, in a case in which the triplet energy of the exciplex is about 2.5 eV to about 2.8 eV, the triplet energy of the exciplex may be greater than the triplet energies of the red light-emitting dopant and the green light-emitting dopant, and the red light-emitting dopant and the green light-emitting dopant may emit phosphorescent light. In contrast, with respect to the blue light-emitting dopant, the singlet energy may be similar to the triplet energy of the exciplex, and the blue light-emitting dopant may emit fluorescent light.

In the third sub-emission layer including the blue light-emitting dopant, the triplet energy of the exciplex may be adjusted to enable or facilitate thermally activated delayed fluorescence (TADF) in the blue light-emitting dopant, and thus, fluorescent light as well as phosphorescent light may be emitted from the third sub-emission layer.

Thus, in a case in which both of the hole-transporting host and the electron-transporting host that form the exciplex are included in the sub-emission layer and the triplet energy of the formed exciplex is about 2.5 eV to about 2.8 eV, light may be emitted from all of the first to third sub-emission layers. For example, fluorescent light as well as phosphorescent light may be emitted when a single sub-emission layer includes a blue light-emitting dopant, and efficiency of the organic light-emitting device according to the embodiment may be improved.

In an implementation, in a case in which the triplet energy level of the exciplex is equal to or greater than the triplet energy levels of the red light-emitting dopant and the green light-emitting dopant and simultaneously, is similar to the singlet energy level of the blue light-emitting dopant, light may be emitted from all of the first to third sub-emission layers.

The hole-transporting host and the electron-transporting host that form the exciplex having a triplet energy greater than a triplet energy of the light-emitting dopant may be simultaneously included in the first sub-emission layer and the second sub-emission layer. For example, in the organic light-emitting device of FIG. 5, the same material may be used as the hole-transporting host and the electron-transporting host which are included in the first sub-emission layer EML-R and the second sub-emission layer EML-G.

The hole-transporting host and the electron-transporting host in a premixed state may be provided before being provided to the emission layer.

In an implementation, in a case in which the mixed host material is used even in the third sub-emission layer EML-B, the third sub-emission layer EML-B may include the same hole-transporting host and electron-transporting host as those included in the first and second sub-emission layers. Thus, in a case in which the same host material is used in the plurality of sub-emission layers EML-R, EML-G, and EML-B, the host material may be deposited on the plurality of sub-emission layers EML-R, EML-G, and EML-B using the same equipment, and productivity in the fabrication of the organic light-emitting device may be improved and fabrication costs may be reduced.

The sub-emission layers EML-R, EML-G, and EML-B may allow the holes provided from the hole control layer HCL to be effectively transferred to the emission layer EML by including the hole-transporting host. Also, the sub-emission layers EML-R, EML-G, and EML-B may allow the electrons provided from the electron control layer ECL to be effectively transferred to the emission layer EML by including the electron-transporting host.

For example, referring again to FIG. 6, the holes provided from the first electrode E1 may be transferred from the hole transport layer HTL along the HOMO energy level of the hole-transporting host included in the emission layer, and the holes may be easily provided to the emission layer. Also, the electrons provided from the second electrode E2 may be easily provided from the electron transport layer ETL to the emission layer along the LUMO energy level of the electron-transporting host included in the emission layer.

Thus, electrons and holes may be effectively provided to the emission layer by including both of the hole-transporting host and the electron-transporting host in the emission layer, and the efficiency of the organic light-emitting device according to the embodiment may be increased and the driving voltage of the organic light-emitting device may be reduced.

In the energy band diagram illustrated in FIG. 6, a difference G1 between a LUMO energy level of the hole-transporting host and a LUMO energy level of the electron-transporting host may be about 0.2 eV or more. Also, a difference G2 between a HOMO energy level of the hole-transporting host and a HOMO energy level of the electron-transporting host may be about 0.2 eV or more. The hole-transporting host and the electron-transporting host may respectively block the movement of the electrons and holes by the difference between the energy levels of the hole-transporting host and the electron-transporting host. Thus, density of the electrons and holes staying in the emission layer may be increased and accordingly, the luminous efficiency of the emission layer may be further improved.

In the organic light-emitting device according to the embodiment, the hole-transporting host and the electron-transporting host provided to each sub-emission layer may be mixed in advance and may then be provided as a host material to the sub-emission layer. Host materials having different functions may be mixed in advance and provided, and non-uniformity of the host material in the sub-emission layer may be minimized. Accordingly, uniform light-emitting characteristics may be obtained in a single sub-emission layer.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Tables 1 and 2 compare characteristics of organic light-emitting devices in a case in which a single host material was included in a sub-emission layer and a case in which two host materials were mixed and used in a sub-emission layer. Table 1 illustrates driving voltage, luminous efficiency, and color coordinate of the sub-emission layer including a red light-emitting dopant.

TABLE 1

| Category | Driving voltage (V) | Luminous efficiency (cd/A) | CIEx | CIEy |
| --- | --- | --- | --- | --- |
| Comparative Example 1 | 4.5 | 55.7 | 0.669 | 0.330 |
| Example 1 | 3.6 | 56.6 | 0.666 | 0.333 |

Comparative Example 1 was the case of the sub-emission layer including only a single host and a red light-emitting dopant, and Example 1 was the case in which a red light-emitting dopant and a mixed host of hole-transporting host and electron-transporting host were used. Specifically, Comparative Example 1 corresponded to a case in which an anthracene-based electron-transporting host was doped with about 3 wt % of the red light-emitting dopant, and Example 1 corresponded to a case in which a premixed host material (in which an anthracene-based electron-transporting host and a carbazole-based hole-transporting host were mixed in a ratio of about 30:70) was doped with about 5 wt % of the red light-emitting dopant.

When comparing Comparative Example 1 and Example 1, it may be seen that the driving voltage of Example 1 was decreased, compared with that of Comparative Example 1, while exhibiting the same color coordinate (CIEx and CIEy). Also, it may be seen that the luminous efficiency of Example 1 was increased in comparison to that of Comparative Example 1.

Table 2 illustrates driving voltage, luminous efficiency, and color coordinate of the sub-emission layer including a green light-emitting dopant.

TABLE 2

| Category | Driving voltage (V) | Luminous efficiency (cd/A) | CIEx | CIEy |
| --- | --- | --- | --- | --- |
| Comparative Example 2 | 4.3 | 127.2 | 0.259 | 0.705 |
| Example 2 | 3.6 | 137.7 | 0.225 | 0.731 |

Comparative Example 2 was a case in which the sub-emission layer included only a single host and a green light-emitting dopant, and Example 2 was a case in which a green light-emitting dopant and a mixed host of hole-transporting host and electron-transporting host were used. Specifically, Comparative Example 2 corresponded to a case in which an anthracene-based electron-transporting host was doped with about 5 wt % of the green light-emitting dopant, and Example 2 corresponded to a case in which a premixed host material (in which an anthracene-based electron-transporting host and a carbazole-based hole-transporting host were mixed in a ratio of about 50:50) was doped with about 5 wt % of the green light-emitting dopant.

When comparing Comparative Example 2 and Example 2, it may be seen that the driving voltage of Example 2 was decreased, compared to that of Comparative Example 2, while exhibiting the same color coordinate (CIEx and CIEy). Also, it may be seen that the luminous efficiency of Example 2 was increased in comparison to that of Comparative Example 2.

Thus, from the results of Tables 1 and 2, it may be seen that the efficiency of the organic light-emitting device was improved in the case that the hole-transporting host and the electron-transporting host were mixed and used in the emission layer. Also, it may be seen that the driving voltage was also reduced.

A mixing ratio of the hole-transporting host to the electron-transporting host in the mixed host provided in the sub-emission layer may be about 80:20 to about 20:80. The hole-transporting host and the electron-transporting host in the mixed host may be provided at the same ratio to the first to third sub-emission layers. For example, the hole-transporting host and the electron-transporting host mixed at the same ratio may be provided to all of the first to third sub-emission layers.

In an implementation, the mixing ratios of the hole-transporting host to the electron-transporting host in the first to third sub-emission layers may be different from one another. For example, in the case that the first sub-emission layer includes a red light-emitting dopant, the mixing ratio of the hole-transporting host to the electron-transporting host may be about 30:70.

In the second sub-emission layer including a green light-emitting dopant, the mixing ratio of the hole-transporting host to the electron-transporting host may be about 70:30. In the third sub-emission layer including a blue light-emitting dopant, the mixing ratio of the hole-transporting host to the electron-transporting host may be about 50:50.

In an implementation, the mixing ratio of the hole-transporting host to the electron-transporting host may be adjusted within a range of about 80:20 to about 20:80 depending on the required triplet energy level of the exciplex.

Also, the same hole-transporting host and electron-transporting host may be mixed in different ratios and used in the first to third sub-emission layers. In an implementation, different hole-transporting hosts and electron-transporting hosts may be used. For example, the hole-transporting host and electron-transporting host may be selected so that energy may be effectively transferred to the light-emitting dopant of each emission layer.

Figure 7:
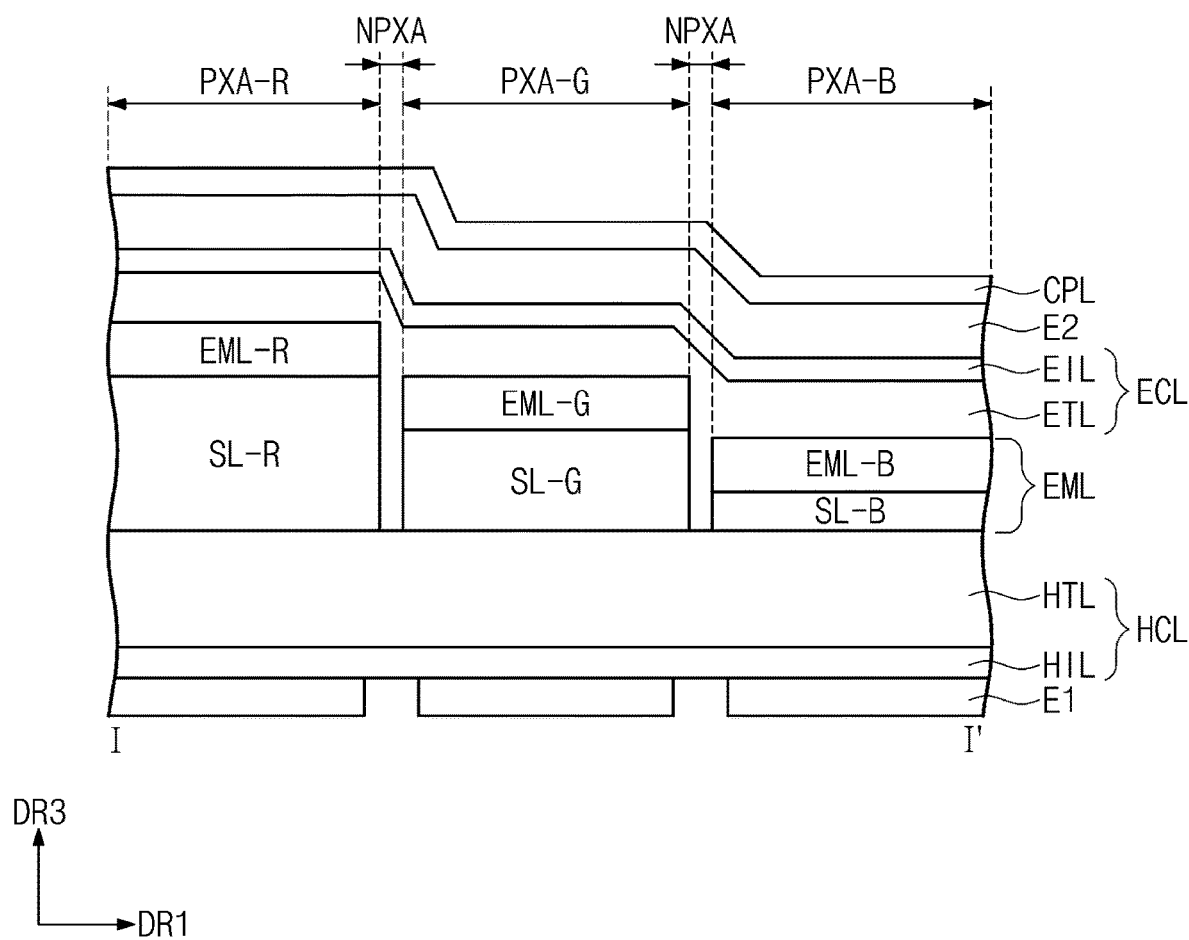
FIGS. 7 and 8 illustrate cross-sectional views of an organic light-emitting device according to an embodiment.
Figure 8:
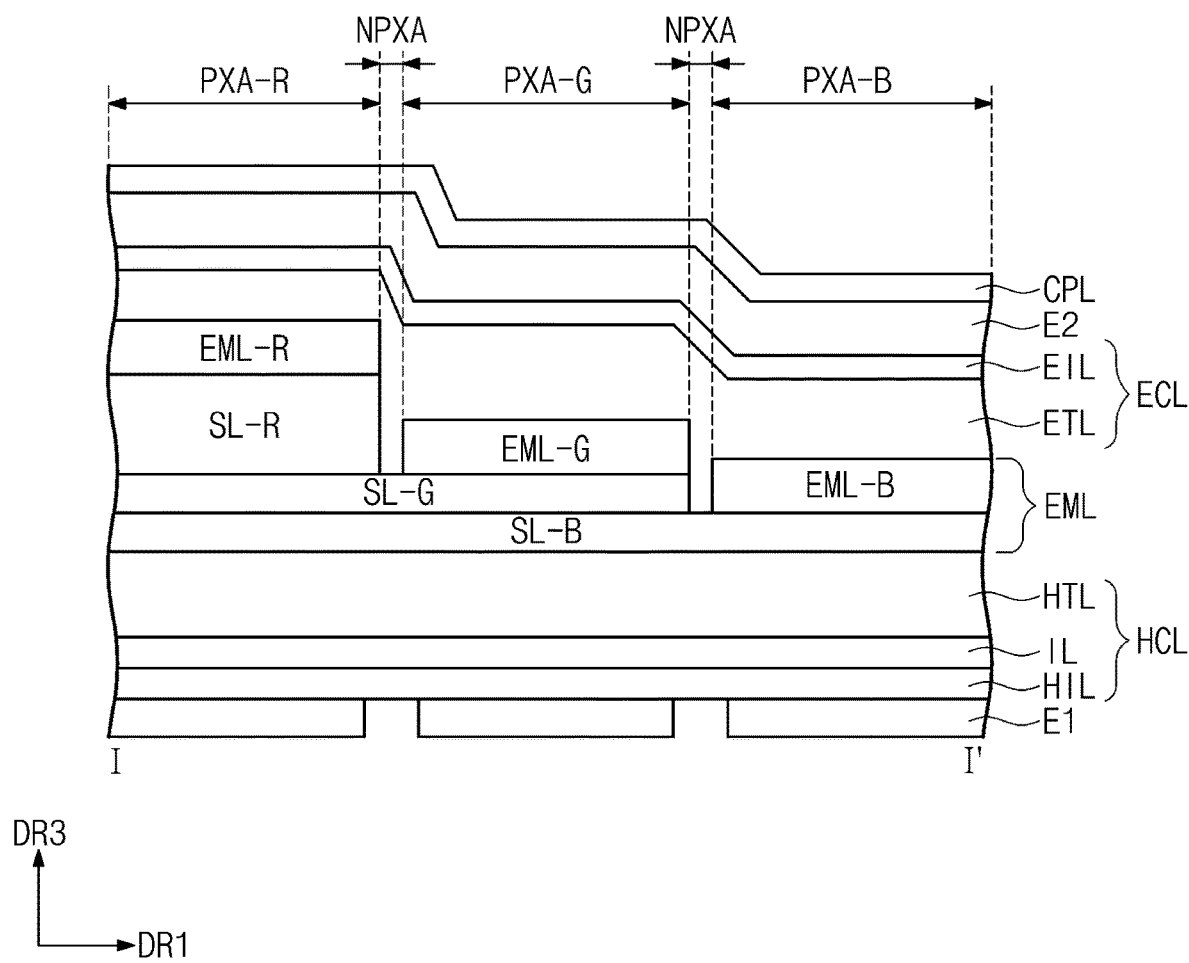

FIGS. 7 and 8 illustrate cross-sectional views of other embodiments of the organic light-emitting device. Hereinafter, points different from the above-described organic light-emitting device according to the embodiment illustrated in FIG. 5 will be mainly described in detail, and undescribed parts may be appreciated with reference to the above-described organic light-emitting device according to the embodiment.

In the embodiments of the organic light-emitting device of FIGS. 7 and 8, auxiliary layers SL-R, SL-G, and SL-B may be further included in the emission layer EML.

The auxiliary layers SL-R, SL-G, and SL-B may be disposed between the hole transport layer HTL and the sub-emission layers EML-R, EML-G, and EML-B. The auxiliary layers SL-R, SL-G, and SL-B may be resonance controlling layers of the emission layer. For example, the auxiliary layers SL-R, SL-G, and SL-B may be disposed between the hole transport layer HTL and each of the sub-emission layers EML-R, EML-G, and EML-B to adjust resonance distances of the sub-emission layers EML-R, EML-G, and EML-B. For example, thicknesses of the auxiliary layers SL-R, SL-G, and SL-B may be proportional to a wavelength of the light emitted from the emission layer, and a resonance distance between the first electrode E1 and the second electrode E2 may be adjusted by the thicknesses of the auxiliary layers SL-R, SL-G, and SL-B.

For example, referring to FIG. 7, in the case that the first sub-emission layer EML-R is a red light-emitting layer and the second sub-emission layer EML-G and the third sub-emission layer EML-B are respectively green and blue light-emitting layers, the thickness of the auxiliary layer SL-R under the first sub-emission layer may be the largest and the thickness of the auxiliary layer may be gradually decreased from the first sub-emission layer to the second and third sub-emission layers. For example, a thicker auxiliary layer may be provided as the wavelength is increased.

FIG. 8 illustrates a case in which the auxiliary layers SL-R, SL-G, and SL-B are formed by being sequentially stacked in the third direction DR3 as the thickness direction. In this case, the auxiliary layer SL-B functioning as the resonance controlling layer for the third sub-emission layer EML-B corresponds to only a single auxiliary layer formed on the hole transport layer HTL, and two auxiliary layers, i.e., the auxiliary layers SL-B and SL-G, function as the resonance controlling layer for the second sub-emission layer EML-G. Also, the sequentially stacked three auxiliary layers SL-R, SL-G, and SL-B may function as the resonance controlling layer for the first sub-emission layer EML-R.

In FIGS. 7 and 8, the auxiliary layers SL-R, SL-G, and SL-B included in the organic light-emitting device according to the embodiment may be formed of the same material or may be formed of different materials.

In the embodiment of FIG. 8, an intermediate layer IL between the hole injection layer HIL and the hole transport layer HTL may be further included in the hole control layer HCL. The intermediate layer IL may further facilitate the injection of holes.

The organic light-emitting device according to the embodiment described in FIGS. 5, 7, and 8 may be included in the above-described organic light-emitting display apparatus according to the embodiment. For example, the organic light-emitting device according to the embodiment described in FIGS. 5 and 7 may be used in a small and medium-sized display apparatus such as a portable terminal, and the organic light-emitting device according to the embodiment described in FIG. 8 may be used in a medium and large-sized display apparatus such as a monitor and a TV.

The organic light-emitting display apparatus including the organic light-emitting device according to the embodiment may have improved efficiency by including the hole-transporting host and electron-transporting host which form the exciplex in the emission layer. Also, in the case that the same mixed host material is used in each of the sub-emission layers included in the emission layer, productivity may be improved.

Figure 9A:
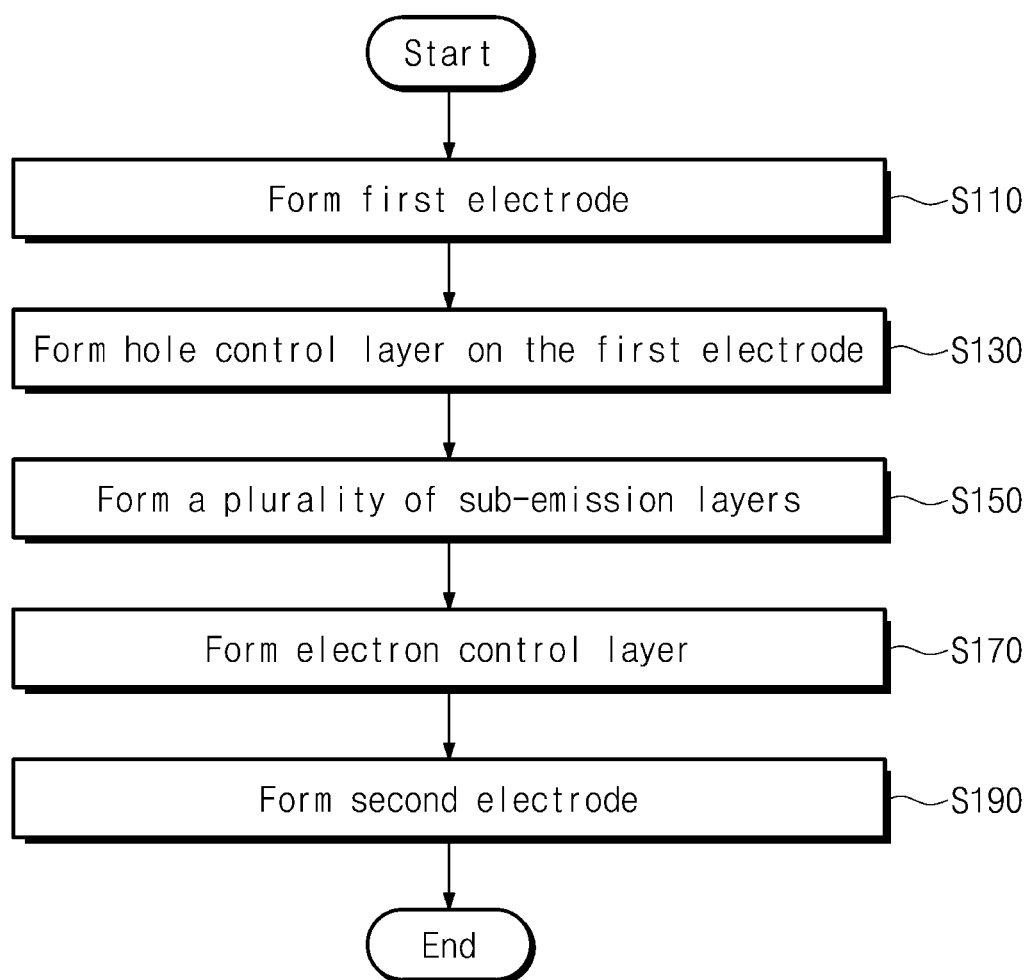
FIGS. 9A and 9B illustrate flowcharts of a method of fabricating an organic light-emitting device according to an embodiment.
Figure 9B:
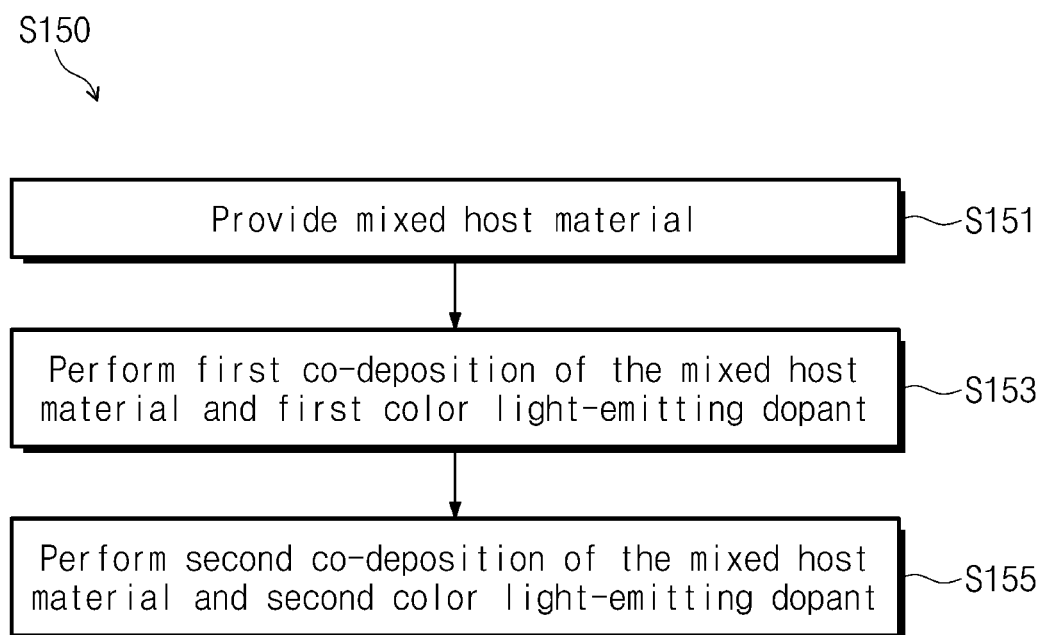

FIGS. 9A and 9B illustrate flowcharts of a method of fabricating an organic light-emitting device according to an embodiment. In the following description about the method of fabricating an organic light-emitting device, each organic layer of the above-described organic light-emitting device according to the embodiment will not be described in detail, but fabrication steps will only be described.

The method of fabricating an organic light-emitting device according to the embodiment may include the steps of: forming a first electrode (S110), forming a hole control layer on the first electrode (S130), forming a plurality of sub-emission layers (S150), forming an electron control layer (S170), and forming a second electrode (S190).

The hole control layer may be formed on the first electrode which is formed by step S110 of forming a first electrode. For example, the first electrode may be disposed on a base substrate. The first electrodes may be disposed on the base substrate by being spaced apart from one another as in the organic light-emitting device according to the embodiment.

The hole control layer may be provided on the first electrode. In this case, the hole control layer may be provided as a single layer or may be provided as a plurality of layers. For example, the hole control layer may be provided to include a hole injection layer on the first electrode and a hole transport layer on the hole injection layer.

The plurality of sub-emission layers may be formed on the hole control layer. The plurality of sub-emission layers may be sequentially formed. For example, in a case in which the organic light-emitting device according to the embodiment illustrated in FIG. 5 is fabricated, the third sub-emission layer EML-B is provided, and the second sub-emission layer EML-G and the first sub-emission layer EML-R may then be sequentially provided.

The step S150 of forming a plurality of sub-emission layers may include the steps of: providing a mixed host material (S151) and performing a first co-deposition of the mixed host material and a first color light-emitting dopant (S153). Also, the step S150 of forming a plurality of sub-emission layers may include performing a second co-deposition of the mixed host material and a second color light-emitting dopant (S155), after the first co-deposition (S153).

The sub-emission layers may be sequentially formed, and forming an electron control layer (S170) may then be performed. In an implementation, the electron control layer may be formed by sequentially stacking an electron transport layer and an electron injection layer, or the electron control layer may be formed in a single layer.

Next, the second electrode may be formed on the electron control layer.

Also, the method of fabricating an organic light-emitting device according to the embodiment may further include forming an auxiliary layer. In an implementation, the forming of the auxiliary layer may be performed after the step S130 of forming a hole control layer. For example, the auxiliary layer may be formed before the step S150 of forming a plurality of sub-emission layers, or some sub-emission layers among the plurality of sub-emission layers are formed and the forming of the auxiliary layer may then be performed.

For example, in the method of fabricating an organic light-emitting device according to the embodiment illustrated in FIG. 7, a step of forming the auxiliary layer SL-B corresponding to the resonance controlling layer of the third sub-emission layer may be first performed after a step of forming the hole transport layer HTL, and the third sub-emission layer EML-B may then be formed. Thereafter, the auxiliary layer SL-G corresponding to the resonance controlling layer of the second sub-emission layer EML-G is formed, and the auxiliary layer SL-R corresponding to the resonance controlling layer of the first sub-emission layer and the first sub-emission layer EML-R are sequentially formed.

Thus, the forming of the auxiliary layer may be performed before the forming of the sub-emission layer or before the forming of the some sub-emission layers.

Figure 10:
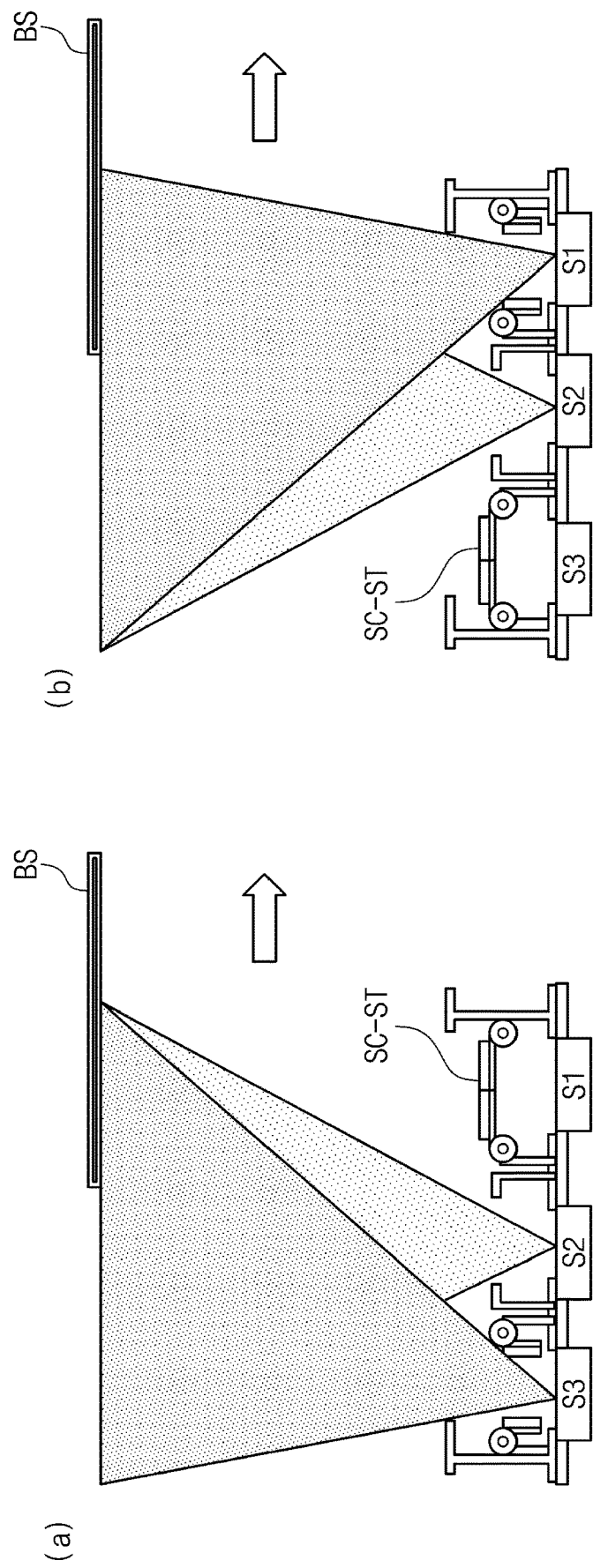
FIG. 10 illustrates a schematic view of a stage of forming a plurality of emission layers in the method of fabricating an organic light-emitting device according to the embodiment.

FIG. 10 exemplarily illustrates a process of depositing a mixed host material and a light-emitting dopant on the emission layer. In FIG. 10, a case is exemplarily illustrated in which performing a deposition of two different light-emitting dopants, i.e., forming two sub-emission layers, is performed in a single chamber. In an implementation, formation of a plurality of sub-emission layers may be stepwise performed in different chambers or formation of three or more sub-emission layers may be performed in a single chamber.

Referring to FIG. 10, a substrate BS, on which a hole control layer is formed, may be transferred in one direction in the chamber, and, at the transferred position, a mixed host material and a single dopant material may be deposited at the same time. For example, in part (a) of FIG. 10, the mixed host material may be provided by a source S2 and the single light-emitting dopant material may be provided by a source S3 to form a sub-emission layer on the substrate. In this case, a source S1, a remaining light-emitting dopant material, is kept closed by a source shutter SC-ST.

In part (b) of FIG. 10 after the deposition shown in part (a), the mixed host material may be provided by the source S2 and the remaining light-emitting dopant material may be provided by the source S1 to form a sub-emission layer on the substrate. In this case, the source S3, the light-emitting dopant already deposited, may be kept closed by a source shutter SC-ST.

The mixed host material (being in a premixed state) may be provided before the deposition in the forming of the sub-emission layers. The premixed host material may be provided by a single source and the same mixed host material provided by the single source may be provided to the plurality of sub-emission layers having different emission wavelengths, and there may be no need to add a separate source for the host material. In an implementation, the plurality of sub-emission layers may be formed in a single chamber, and the productivity of the process may be improved.

Also, the premixed host material may be provided, and uniform luminescent properties may be obtained in a single sub-emission layer.

The sub-emission layers may be formed by using the premixed hole host material and electron host material, and the above-described method of fabricating an organic light-emitting device according to the embodiment may provide uniform luminescent properties in the sub-emission layers. Also, a deposition process may be performed in a single chamber when the same mixed host material is applied to the plurality of sub-emission layers, and the fabrication process may be simplified to help improve the productivity.

The embodiments may provide an organic light-emitting device and an organic light-emitting display apparatus including the same, in which efficiencies of the device and the display apparatus may be increased and lifetime may be extended.

The embodiments may provide a method of fabricating an organic light-emitting device in which an organic light-emitting device may be provided, in which the efficiency may be increased and the lifetime may be extended.

The embodiments may provide organic light-emitting devices having improved efficiency, organic light-emitting display apparatuses including the same, and methods of fabricating an organic light-emitting device, which improve productivity of the organic light-emitting device.

The embodiments may provide an organic light-emitting device having high efficiency as well as improved productivity and an organic light-emitting display apparatus including the same.

The embodiments may provide a method of fabricating an organic light-emitting device in which fabrication costs are reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
   a first electrode;
   a hole control layer on the first electrode;
   an emission layer on the hole control layer;
   an electron control layer on the emission layer;
   a second electrode on the electron control layer; and
   a capping layer on the second electrode,
   wherein the emission layer comprises a first sub-emission layer, a second sub-emission layer, and a third sub-emission layer,
   the first sub-emission layer comprises a first hole-transporting host, a first electron-transporting host, and a red light-emitting dopant,
   the second sub-emission layer comprises a second hole-transporting host, a second electron-transporting host, and a green light-emitting dopant,
   the third sub-emission layer comprises a third hole-transporting host, a third electron-transporting host, and a blue light-emitting dopant,
   the red light-emitting dopant and green light-emitting dopant emit phosphorescent light, and
   the blue light-emitting dopant emits thermally activated delayed fluorescence (TADF) light.

2. The organic light-emitting device as claimed in claim 1,
wherein the first hole-transporting host and the first electron-transporting host form a first exciplex, and
a triplet energy of the first exciplex is equal to or greater than a triplet energy of the red light-emitting dopant.

3. The organic light-emitting device as claimed in claim 2,
wherein the triplet energy of the first exciplex is about 2.4 eV to about 3.0 eV.

4. The organic light-emitting device as claimed in claim 1,
wherein the second hole-transporting host and the second electron-transporting host form a second exciplex, and
a triplet energy of the second exciplex is equal to or greater than a triplet energy of the green light-emitting dopant.

5. The organic light-emitting device as claimed in claim 4,
wherein the triplet energy of the second exciplex is about 2.4 eV to about 3.0 eV.

6. The organic light-emitting device as claimed in claim 1,
wherein the third hole-transporting host and the third electron-transporting host form a third exciplex, and
a difference between a triplet energy level of the third exciplex and a singlet energy level of the blue light-emitting dopant is about −0.1 eV to about 0.1 eV.

7. The organic light-emitting device as claimed in claim 1,
wherein the electron control layer comprises:
an electron transport layer; and
an electron injection layer on the electron transport layer,
wherein the electron injection layer comprises LiF, LiQ, Li2O, BaO, NaCl, Yb, CsF, RbCl, or RbI.

8. The organic light-emitting device as claimed in claim 1,
wherein the hole control layer comprises:
a hole injection layer; and
a hole transport layer on the hole injection layer,
the hole injection layer comprises p-type dopant, and
the p-type dopant is one selected from a quinone derivative, a metal oxide, and a cyano group-containing compound.

9. The organic light-emitting device as claimed in claim 1,
wherein the capping layer comprises at least one of an amine compound, a carbazole compound, or a naphthalene compound.

10. The organic light-emitting device as claimed in claim 1,
wherein a difference between a lowest unoccupied molecular orbital (LUMO) energy level of the first hole-transporting host and a LUMO energy level of the first electron-transporting host is about 0.2 eV or more.

11. The organic light-emitting device as claimed in claim 1,
wherein a difference between a lowest unoccupied molecular orbital (LUMO) energy level of the second hole-transporting host and a LUMO energy level of the second electron-transporting host is about 0.2 eV or more.

12. An organic light-emitting display apparatus, comprising:
a timing controller;
a scan driver;
a source driver; and
an organic light-emitting display panel including an organic light-emitting device,
wherein the organic light-emitting device comprises:
a first electrode;
a hole control layer on the first electrode;
an emission layer on the hole control layer;
an electron control layer on the emission layer; and
a second electrode on the electron control layer,
the emission layer comprises a first sub-emission layer, a second sub-emission layer, and a third sub-emission layer,
the first sub-emission layer comprises a first hole-transporting host, a first electron-transporting host, and a red light-emitting dopant,
the second sub-emission layer comprises a second hole-transporting host, a second electron-transporting host, and a green light-emitting dopant,
the third sub-emission layer comprises a third hole-transporting host, a third electron-transporting host, and a blue light-emitting dopant,
the red light-emitting dopant and green light-emitting dopant emit phosphorescent light, and
the blue light-emitting dopant emits phosphorescent light and thermally activated delayed fluorescence (TADF) light.

13. The organic light-emitting display apparatus as claimed in claim 12,
wherein the first hole-transporting host and the first electron-transporting host form a first exciplex, and
a triplet energy of the first exciplex is equal to or greater than a triplet energy of the red light-emitting dopant.

14. The organic light-emitting display apparatus as claimed in claim 12,
wherein the second hole-transporting host and the second electron-transporting host form a second exciplex, and
a triplet energy of the second exciplex is equal to or greater than a triplet energy of the green light-emitting dopant.

15. The organic light-emitting display apparatus as claimed in claim 12,
wherein the third hole-transporting host and the third electron-transporting host form a third exciplex, and
a difference between a triplet energy level of the third exciplex and a singlet energy level of the blue light-emitting dopant is about −0.1 eV to about 0.1 eV.

* * * * *